(12) United States Patent  (10) Patent No.: US 7,692,467 B2
Beker (45) Date of Patent: Apr. 6, 2010

(54) CAPACITANCE FOR DECOUPLING INTERMEDIATE LEVEL POWER RAILS

(75) Inventor: Benjamin Beker, Spicewood, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 434 days.

(21) Appl. No.: 11/670,969

(22) Filed: Feb. 3, 2007

(65) Prior Publication Data

US 2008/0186649 A1 Aug. 7, 2008

(51) Int. Cl.
*H03K 5/08* (2006.01)
(52) U.S. Cl. .................. 327/311; 327/532; 327/530
(58) Field of Classification Search .......... 327/308, 327/530–532, 310–311
See application file for complete search history.

(56) References Cited

U.S. PATENT DOCUMENTS

| | | | | |
|---|---|---|---|---|
| 4,853,833 | A * | 8/1989 | Fiorina et al. | 363/47 |
| 5,796,296 | A * | 8/1998 | Krzentz | 327/545 |
| 6,373,348 | B1 * | 4/2002 | Hagerup | 333/81 A |
| 7,474,539 | B2 | 1/2009 | Huang et al. | |

OTHER PUBLICATIONS

U.S. Appl. No. 12/406,265, filed Mar. 18, 2009, Benjamin Beker et al.

Benjamin Beker et al.; *Electrical Performance of Integrated Decoupling Capacitor Arrays*; 1996; pp. 1-14.

Benjamin Beker et al.; *Analysis of Microwave Capacitors and IC Packages*; IEEE Transactions on Microwave Theory and Techniques; vol. 42, No. 9; Sep. 1994; pp. 1759-1764.

George J. Cokkinides et al; *Direct Computation of Capacitance in Integrated Passive Components Containing Floating Conductors*; IEEE Transactions on Components, Packaging, and Manufacturing Technology—Part B; vol. 20, No. 2; May 1997; pp. 123-128.

Ken Kundert, Designer's Guide Consulting, Inc.; *Power Supply Noise Reduction*; www.designers-guide.org; Version 4; Jan. 2004; pp. 1-12.

Tom Ruttan et al.; *Inductive compensation for package impedance discontinuity*; Intel Corporation; 2005; pp. 1-15.

* cited by examiner

*Primary Examiner*—Dinh T. Le
(74) *Attorney, Agent, or Firm*—Timothy M. Honeycutt (57) ABSTRACT

Capacitive decoupling circuits and methods of making the same are disclosed. In one aspect, a method of manufacturing is provided that includes providing a semiconductor chip with a first power rail for a first no-load bias level and a ground rail. A first voltage divider is electrically coupled between the first power rail and the ground rail and has a midpoint node. A first pair of capacitors is electrically coupled between the first power rail, the midpoint node and the ground rail to provide capacitive decoupling for power delivered to the first power rail. A second power rail has a second no-load bias less than the first no-load bias. A second pair of capacitors is electrically coupled between the ground rail and the second power rail to provide capacitive decoupling for power delivered to the second power rail.

27 Claims, 6 Drawing Sheets

CAPACITANCE FOR DECOUPLING INTERMEDIATE LEVEL POWER RAILS

BACKGROUND OF THE INVENTION

1. Field of the Invention

This invention relates generally to semiconductor processing, and more particularly to capacitive decoupling systems for integrated circuits and to methods of making the same.

2. Description of the Related Art

Cascode style circuits, such as those frequently used in microprocessors, graphics processors and application specific integrated circuits, typically require full-voltage and midpoint-voltage power supply rails. The on-die decoupling capacitance used to suppress power supply noise is typically also formed by stacking capacitors from a ground rail to the mid-voltage rail and from the mid-voltage rail to the full-voltage rail. This stacking introduces an AC voltage divider which inherently couples noise from the full-voltage rail on to the mid-voltage rail.

The issue of noise from the full-voltage rail coupling over to the mid-voltage rail may be particularly problematic for switching input/output circuits where the noise on the full-voltage rail can be significantly higher than the noise on mid-voltage rail. The reason is that high current draw devices, such as the output stages of input/output drivers or active terminations at the input stages of receivers are connected to the full-voltage rail, while lower power circuits are connected to the mid-voltage rail. One particular example of a high current draw device is an input/output driver for an external random access memory device. Another drawback of the conventional cascode architecture is the filtering nature of the conventional capacitor stack. The conventional capacitor stack serves essentially as an all-pass filter when capacitor leakage effects are considered.

One conventional technique for improving decoupling involves providing more raw capacitance on the die. However, this technique may be severely constrained by the requirements of packing density or will lead to die size growth.

The present invention is directed to overcoming or reducing the effects of one or more of the foregoing disadvantages.

SUMMARY OF THE INVENTION

In accordance with one aspect of the present invention, a method of manufacturing is provided that includes providing a semiconductor chip and forming thereon a first power rail for a first no-load bias level and a ground rail. A first voltage divider is formed on the semiconductor chip and electrically coupled between the first power rail and the ground rail and having a midpoint node. A first pair of capacitors is formed on the semiconductor chip. The first of the two capacitors is electrically coupled between the first power rail and the midpoint node and the second of two capacitors is electrically coupled between the midpoint node and the ground rail to provide capacitive decoupling for power delivered to the first power rail. A second power rail is formed on the semiconductor chip and has a second no-load bias less than the first no-load bias. A second pair of capacitors is formed on the semiconductor chip. The first of the second pair of capacitors is electrically coupled between the ground rail and the second power rail and the second of the second pair of capacitors is electrically coupled between the second power rail and the ground rail to provide capacitive decoupling for power delivered to the second power rail.

In accordance with another aspect of the present invention, an apparatus is provided that includes a semiconductor chip and a first power rail on the semiconductor chip that has a first no-load bias. A ground rail is positioned on the semiconductor chip. A first voltage divider is positioned on the semiconductor chip and electrically coupled between the first power rail and the ground rail. The first voltage divider has a midpoint node. A first pair of capacitors is positioned on the semiconductor chip. The first of the first pair of capacitors is electrically coupled between the first power rail and the midpoint node and the second of the first pair of capacitors is electrically coupled between the midpoint node and the ground rail to provide capacitive decoupling for power delivered to the first power rail. A second power rail is positioned on the semiconductor chip and has a second no-load bias less than the first no-load bias. A second pair of capacitors is positioned on the semiconductor chip. The first of the second pair of capacitors is electrically coupled between the ground rail and the second power rail and the second of the second pair of capacitors is electrically coupled between the second power rail and the ground rail to provide capacitive decoupling for power delivered to the second power rail.

In accordance with another aspect of the present invention, an apparatus is provided that includes a semiconductor chip and an input/output circuit on the semiconductor chip. The input/output circuit includes a first power rail that has a first no-load bias, a ground rail, and a first voltage divider electrically coupled between the first power rail and the ground rail. The first voltage divider has a midpoint node. The input/output circuit includes a first pair of capacitors, the first of which is electrically coupled between the first power rail and the midpoint node and the second of which is electrically coupled between the midpoint node and the ground rail to provide capacitive decoupling for power delivered on the first power rail. The semiconductor chip further includes a second power rail that has a second no-load bias less than the first no-load bias, and a second pair of capacitors, the first of which is electrically coupled between the ground rail and the second power rail and the second of which is electrically coupled between the second power rail and the ground rail to provide capacitive decoupling for power delivered to the second power rail.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
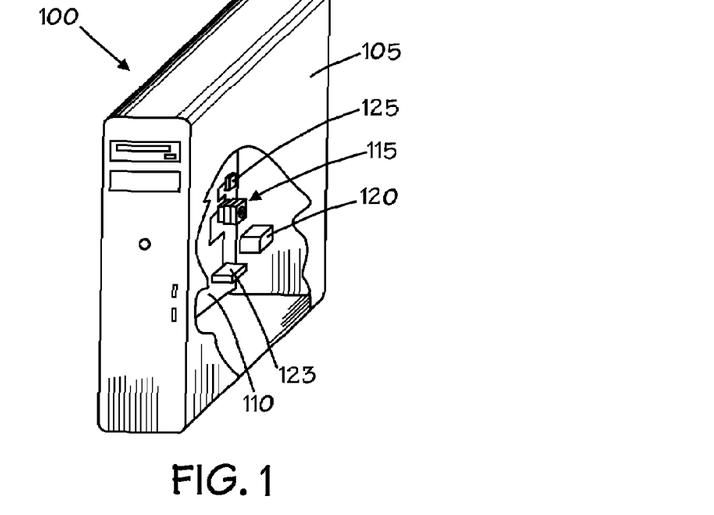
FIG. 1 is a pictorial view of an exemplary embodiment of a computer system.

In the drawings described below, reference numerals are generally repeated where identical elements appear in more than one figure. Turning now to the drawings, and in particular to FIG. 1, therein is shown a pictorial view of an exemplary embodiment of a computer system 100 that includes an enclosure 105. A portion of the enclosure 105 is shown cut away to reveal various components of the computer system 100, including a printed circuit or motherboard 110 and a processor stack 115. In addition, a power supply 120, two devices 123 and 125 external to the processor stack 115 are shown. The device 123 may be a memory module or other device. The device 125 may be a communications or other device. The skilled artisan will appreciate that the computer system 100 might be a personal computer, a server, a part of a larger computer system, a device for testing integrated circuits or any of a huge myriad of other types of devices where integrated circuits are used.

Figure 2:
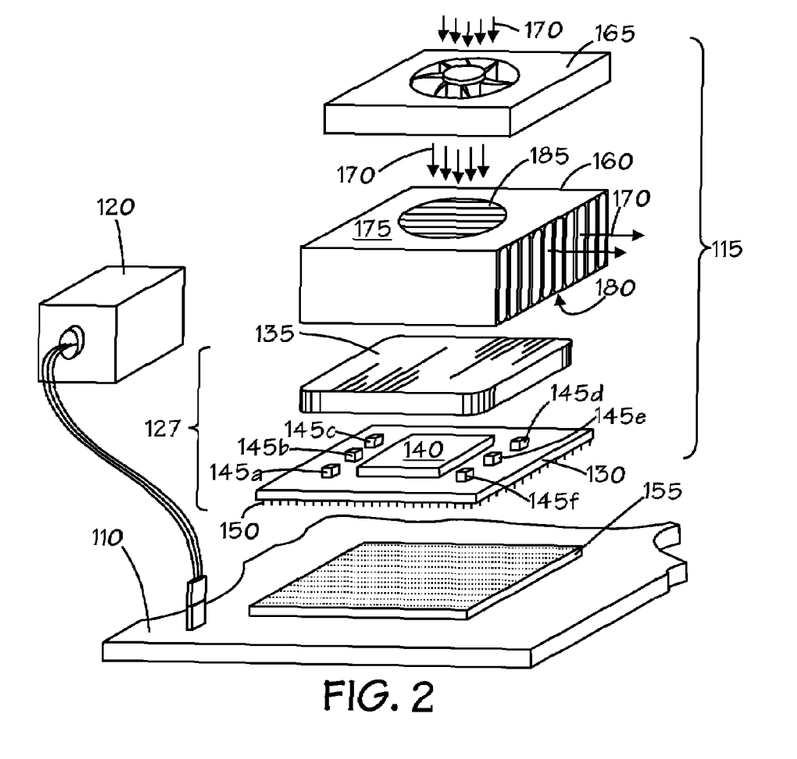
FIG. 2 is an exploded pictorial of an exemplary embodiment of a processor stack for the computer system of FIG. 1.

Additional detail regarding the processor stack 115 depicted in FIG. 1 may be understood by referring now also to FIG. 2, which is an exploded pictorial that shows the processor stack 115 itself exploded, and also exploded from the underlying motherboard 110. The motherboard 110 is of such size that only a portion thereof is depicted in FIG. 2. The processor stack 115 includes an integrated circuit package 127 that has a base substrate 130 and an overlying lid 135. The substrate 130 may be a printed circuit board. The lid 135 may be composed of well-known plastics, ceramics or metallic materials as desired. In an exemplary embodiment, the lid 135 is composed of nickel-coated copper. An integrated circuit 140 is mounted to the substrate 130. The integrated circuit 140 may be a semiconductor device or other type of device as desired. The integrated circuit 140 may be any of a myriad of different types of circuit devices used in electronics, such as, for example, microprocessors, application specific integrated circuits, memory devices or the like. The substrate 130 may be composed of well-known plastics, ceramics, or other materials commonly used for integrated circuit packaging.

One or more decoupling capacitors 145a, 145b, 145c, 145d, 145e and 145f are mounted on the substrate 130. The capacitors 145a, 145b, 145c, 145d, 145e and 145f are designed to provide decoupling of power from the power supply 120 and/or other sources of power that may be provided to the integrated circuit 140. The substrate 130 is provided with a plurality of conductor pins 150 that are designed to seat in respective sockets in a socket 155 positioned on the printed circuit board 110. Power is delivered to the integrated circuit 140 through one or more of the pins 150. Connection methods other than pin-socket, such as soldering, land grid array, ball grid array, surface-mounted pin grid arrays or the like may be used to electrically interconnect the substrate 130 with the motherboard 110.

Cooling of the integrated circuit 140 is provided by way of a heat sink 160 that is designed to be positioned on the package 127 and an optional cooling fan 165 that is designed to be positioned on, slightly above or to the side of the heat sink 160, and provide a flow of air 170. The heat sink 160 may take on a myriad of different shapes and configurations and be composed of metallic or non-metallic materials as desired. Metallic materials, such as copper and alloys thereof, tend to have relatively advantageous coefficients of conductive heat transfer. The heat sink 160 has a side 175 that is designed to face towards and/or be seated on the package 127 and a side 180 that is designed to face towards and/or support the fan 165. The heat sink 160 and the package 127 are adapted to be arranged in the stack 115 that normally includes the fan 165. The stack 115 is depicted in a relatively vertical orientation in FIG. 2. However, the skilled artisan will appreciate that the stack 115 may actually appear to be sideways or otherwise oriented in an actual enclosure, such as the enclosure 105 depicted in FIG. 1. The heat sink 160 may be provided with an opening 185 to allow the air 170 to flow through the side 175 and exit laterally and it should be understood that the flow direction of the air 170 may be reversed if desired. The skilled artisan will appreciate that the heat sink 160 is designed to convey heat away from the integrated circuit 140. Accordingly, it should be understood that this may be accomplished by air cooling, liquid cooling or a combination of the two.

Figure 3:
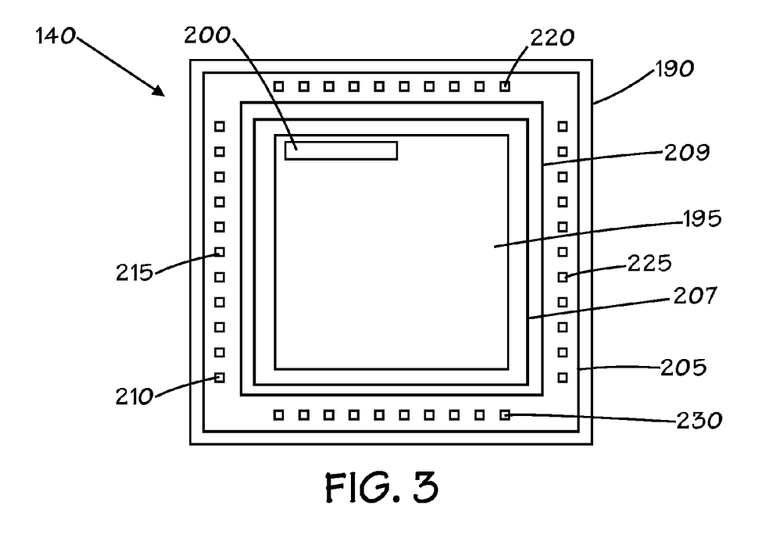
FIG. 3 is a plan view of an exemplary embodiment of a processor for the processor stack depicted in FIG. 2.

FIG. 3 is a plan view of the integrated circuit 140 depicted in FIG. 2. The integrated circuit 140 includes a semiconductor die 190. The die 190 may be a conventional silicon substrate, a silicon-on-insulator or other semiconductor on insulator or some other type of semiconductor material. A circuit or processor core 195 is provided that includes an input/output ("IO") 200 that is designed to interface with devices external to the integrated circuit 140, such as the memory module 123 and/or the communications circuit 125 depicted in FIG. 1. The skilled artisan will appreciate that the integrated circuit 140 may include a single IO interface 200 or plural IO interfaces dependent upon the configuration of the circuit and the requirements for interfacing with external devices. Power and ground are distributed to various portions of the integrated circuit 140 by way of a plurality of power and ground rails. For simplicity of illustration, a few of the power and ground rails are depicted. In particular, a ground rail 205 and a power rails 207 and 209 are illustrated. The power rail 207 is used by the IO logic 200 in order to drive one or more signals to external devices. The power rail 209 is biased at some level typically lower than the rail 207 and is used to provide power to internal devices on the die 190. Since the power rail 207 will be intermittently connected to external devices, there is a need to suppress noise on the 207 rail. Noise suppression is provided by on-die decoupling capacitance. In this regard, the integrated circuit 140 is provided with a plurality of capacitors, a few of which are depicted and designated 210, 215, 220, 225 and 230. Depending upon the complexity and requirements of the integrated circuit 140, there may be hundreds or thousands of capacitors on the die 190. Some percentage of these are devoted to decoupling.

Figure 4:
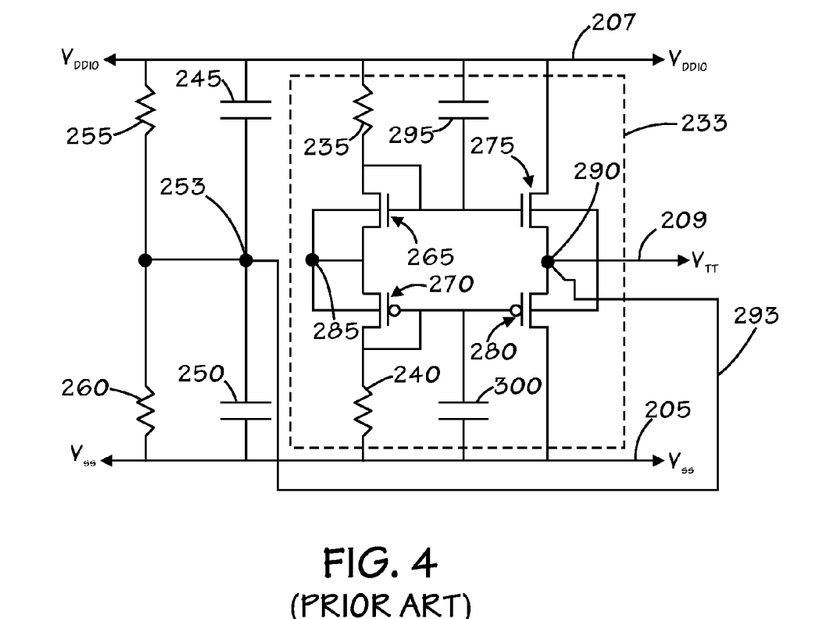
FIG. 4 is a schematic view of a conventional cascode power rail architecture for two power rails.

A conventional circuit incorporating the power rails 207 and 209 may be understood by referring now to the schematic depicted in FIG. 4. A no load voltage level $V_{DDIO}$ is on the power rail 207. A voltage divider network represented by the dashed box 233 is provided in lieu of a straight resistive voltage divider in order to generate a mid-level voltage $V_{TT}$ on the power rail 209. The network 233 provides voltage division with current sourcing capabilities. The network 233 includes resistors 235 and 240 connected between the rail 207 and the ground rail 205. The resistors have respective resistances of $R_{D1}$ and $R_{D2}$. The ground rail 205 is at a voltage level $V_{SS}$. Capacitive decoupling for the power rail 207 is provided by a stack of two series-connected decoupling capacitors 245 and 250. The capacitor 245 is connected between the rail 207 and the node 253 and the capacitor 250 is connected between the node 253 and the ground rail 205. It should be understood that each of the single capacitors 245 and 250 is actually a collection of a number of parallel-connected capacitors. The skilled artisan will appreciate that FIG. 4 represents a cascode architecture in that a stack of capacitors 245 and 250 is used in lieu of a single capacitor for the capacitive decoupling. The capacitors 245 and 250 will exhibit some leakage current which is depicted schematically as two resistors 255 and 260.

The divider network 233 further includes a CMOS pair of transistors 265 and 270 connected in series between the resistors 235 and 240 and another CMOS pair of transistors 275 and 280 connected in series between the power rail 207 and the ground rail 205. The sources of the NMOS transistors 265 and 275 are tied to their respective gates. Similarly, the sources of the PMOS transistors 270 and 280 are tied to their respective gates. The drains of the NMOS and PMOS transistors 270 are connected to a common node 285. The drains of the NMOS and PMOS transistors 275 and 280 are connected to a common node 290 which feeds the rail 209 with a voltage $V_{TT}$. Note that the node 290 is connected to the node 253 by a conductor 293. High frequency filtering of signals reaching the gates of the transistors 265 and 275 is provided by way of a filter capacitor 295. A similar filter capacitor 300 is provided between the ground rail 205 and the gates of the transistors 270 and 280. The purpose of the network of transistors 265, 270, 275 and 280 is to provide a relatively stabilized current at the node 290. This is desirable in situations where the voltage $V_{DDIO}$ on the power rail 207 fluctuates as a result of loading on that rail.

The capacitor 245 has a capacitance $C_{245}$ and the capacitor 250 has a capacitance $C_{250}$. It will be useful to refer to two capacitance parameters. The total physical capacitance $C_{PHYSICAL}$ is the total physical capacitance available to decouple the power rail 207. In this regard, $C_{PHYSICAL}$ is allocated to the two capacitors 245 and 250. The total electrical capacitance $C_{ELECTRICAL}$ is the total electrical capacitance that is available to decouple the power rail 207. For the power rail 207, $C_{PHYSICAL}$ is given by:

$$C_{PHYSICAL} = C_{245} + C_{250} \quad \text{Equation 1}$$

If $C_{245}$ and $C_{250}$ are equal, then Equation 1 simplifies to:

$$C_{PHYSICAL} = 2C_{245} \quad \text{Equation 2}$$

Conversely:

$$C_{245} = \frac{C_{PHYSICAL}}{2} \quad \text{Equation 3}$$

Since the capacitors 245 and 250 are connected in series, the value of $C_{ELECTRICAL}$ is given by:

$$C_{ELECTRICAL} = \frac{C_{PHYSICAL}}{4} \quad \text{Equation 4}$$

There is an obvious electrical inefficiency for the stack of capacitors 245 and 250 since only a fourth of the available physical capacitance is usable electrically.

Another disadvantage of the conventional design depicted in FIG. 4 is that the decoupling capacitance for both $V_{DDIO}$ and $V_{TT}$ are provided by the same network. Thus, $V_{TT}$ may still see significant noise from the $V_{DDIO}$ rail particularly where the $V_{DDIO}$ rail is connected to high current switching devices.

Figure 5:
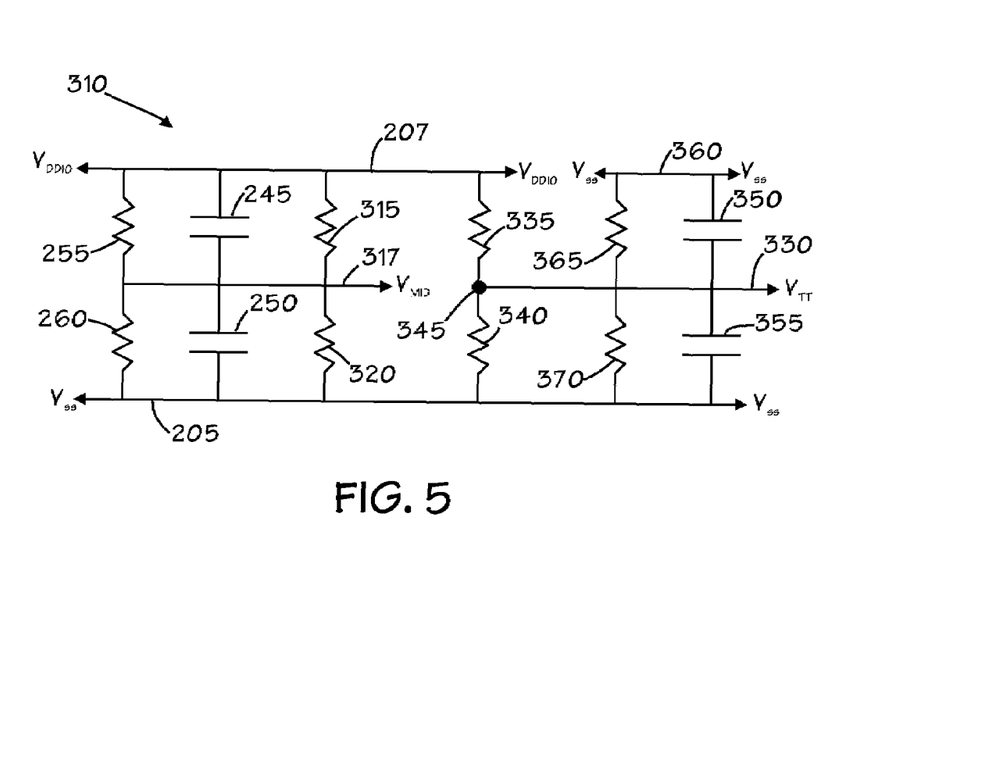
FIG. 5 is a schematic view of an exemplary embodiment of a power rail circuit with separate decoupling capacitance for two power rails.

An exemplary embodiment of a new architecture that provides separate capacitive decoupling for the power rails 207 and 209 may be understood by referring now to FIG. 5. The circuit labeled 310 shares various features with the circuitry depicted in FIG. 4. In particular, capacitive decoupling for the power rail 207 is provided by way of stacked capacitors 245 and 250 connected between the power rail 207 and the ground rail 205. Respective leakages of the capacitors 245 and 250 are depicted as resistors 255 and 260. A voltage divider consisting of resistors 315 and 320 connected between the rail 207 and the ground rail 205. The mid-point 317 of the resistors 315 and 320 provides a mid-level voltage $V_{MID}$. The resistor divider 315-320 sets the midpoint voltage $V_{MID}$ for the decoupling capacitor stack 245 and 250 for the power rail 207.

Unlike the conventional design depicted in FIG. 4, the illustrated embodiment includes a separate voltage divider and decoupling capacitor stack for an internally generated mid-level voltage rail 330 that provides a nominal output voltage $V_{TT}$. The voltage divider consists of resistors 335 and 340 connected in series between the power rail 207 and ground rail 205 with a midpoint node thereof 345 connected to the mid-level voltage rail 330. Of course, it should be understood that the basic resistor voltage divider 335 and 340 may be substituted with another type of voltage divider, such as the current sourcing divider network 233 depicted in FIG. 4. Capacitive decoupling for the power rail 330 is provided by a capacitor stack consisting of two capacitors 350 and 355. The capacitors 350 and 355 are each connected between the mid-voltage rail 330 and ground, in particular the ground rail 205 and a ground rail 360, which may simply be tied to the ground rail 205. A leakage current of the capacitors 350 and 355 is depicted schematically by the resistors 365 and 370. Note that the power rails 317 and 330 are not connected. The capacitors 350 and 355 and the leakage loads 365 and 370 along with the resistors 335 and 340 for the rail 330.

In the foregoing illustrative embodiment, a mid-level voltage signal $V_{TT}$ is generated internally from a higher voltage rail 207 at a voltage level $V_{DDIO}$. However, it is not necessary to generate a mid-level voltage signal internally. Instead, an external source may be used to supply a mid-level voltage signal. This alternative may be understood by referring now to FIG. 6. In this illustrative embodiment 310', the capacitive decoupling for the power rail 207 at no load voltage $V_{DDIO}$ may be provided in the same way as the embodiment depicted in FIG. 5. In this regard, the same combination of decoupling capacitors 245, 250 and resistor divider network consisting of resistors 315 and 320 are provided with a midpoint rail 317. In addition, leakage currents from the capacitors 245 and 250 are represented schematically by the resistors 255 and 260 coupled in series between the rail 207 and the ground rail 205. However, the voltage $V_{TT}$ is provided externally via a node 390 that is connected to a rail 395. Like the embodiment depicted in FIG. 5, capacitive decoupling for the mid-voltage rail 395 is provided by way of capacitors 350 and 355 each coupled between the rail 395 and respective ground rails 205 and 360, both at ground voltage $V_{SS}$. Here again, leakage currents from the capacitors 350 and 355 are depicted schematically as resistors 365 and 370 connected in series between the rail 395 and the respective ground rails 360 and 205. Again, the mid-level power rail 317 is not connected to the mid-level power rail 395. Furthermore, the capacitive decoupling of the rail 207 at $V_{DDIO}$ is separate from the capacitive decoupling of the mid-voltage rail 395.

The selection of the resistance values for the resistors 335 and 340 for an internally-generated $V_{TT}$ should take into consideration the anticipated resistances of the leakage resistors 365 and 370. In this regard, the resistance value $R_{D2}$ of the resistor 340 should be selected to be substantially less than the resistance level of the parallel combination of the resistors 365 and 370. This criteria is necessary to reduce the risk of an unbalanced voltage $V_{TT}$ and what may turn out to be susceptibility to process voltage and temperature variations. Again, the goal is to hold $V_{TT}$ at somewhere around $V_{DDIO}/2$.

Figure 6:
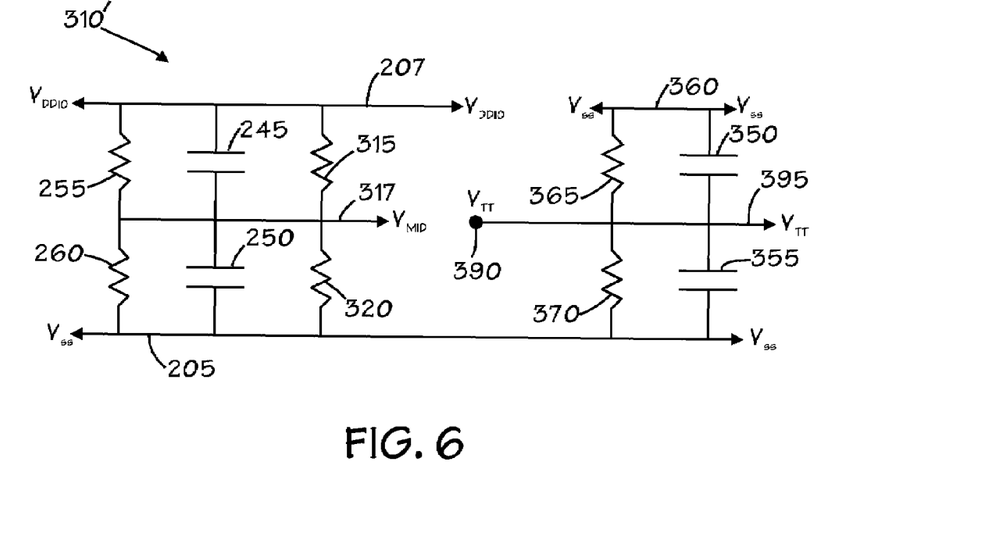
FIG. 6 is a schematic view of an alternate exemplary embodiment of a power rail circuit with separate decoupling capacitance for two power rails.

The values for the capacitors 350 and 355 should be selected based on the anticipated capacitive decoupling requirements for the rails 330 or 395 in the embodiments depicted in FIGS. 5 and 6. The provision of separate capacitive decoupling for the mid-level power rail 330 and/or 395 may be accomplished by making a few modifications to the same general capacitor layout used for a conventional device. In this regard, the division of decoupling capacitance between the group of capacitors 245 and 250 and the group of capacitors 350 and 355 may be made by merely rerouting appropriate interconnects between the available groups of decoupling capacitors on the die 190 (see FIG. 2) or selecting appropriate via connections to particular rails, such 207, 330 and/or 395. Appropriate vias or interconnects may be routed to a select collection of capacitors in order to make up the capacitance values for the capacitors 350 and 355 and the same may be done as well for the capacitors 245 and 250. Again it should be remembered that the individual capacitors 245, 250, 350 and 355 depicted in FIGS. 5 and 6 may actually consist of groups of parallel connected capacitors.

In the conventional design depicted in FIG. 4, the total available physical capacitance $C_{PHYSICAL}$ is allocated between the two capacitors 245 and 250. In this illustrative embodiment, $C_{PHYSICAL}$ is allocated among the four capacitors 245, 250, 350 and 355. As noted above, the way in which this allocation is made can be based on the anticipated capacitive decoupling requirements for the rail 330 or 395 in the embodiments depicted in FIGS. 5 and 6. The capacitors 245 and 250 may be each configured with a capacitance value $C_{VDDIO}$. If there were only two capacitors, then a variant of Equation 3 would yield the value for $C_{VDDIO}$. However, since there are four capacitors involved, the value of $C_{VDDIO}$ is given by:

$$C_{VDDIO} = k \frac{C_{PHYSICAL}}{2} \quad \text{Equation 5}$$

and the capacitance values $C_{350}$ and $C_{355}$ for the capacitors 350 and 355 may be given by:

$$C_{350} = C_{355} = (1-k) \frac{C_{PHYSICAL}}{2} \quad \text{Equation 6}$$

One interesting outcome is the electrical capacitance for the stack of capacitors 350 and 355. Because the capacitors are connected in parallel, the electrical capacitance $C_{ELECTRICAL\ (Caps\ 350\ \&\ C355)}$ is $C_{350}+C_{355}$ or $2C_{350}$ where the two are equal. This is more electrically efficient that a conventional configuration.

Figure 7:
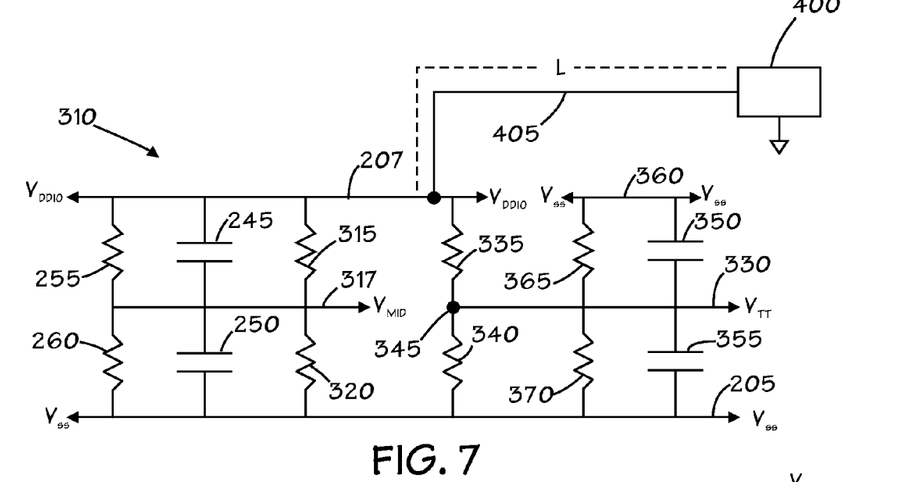
FIG. 7 is a schematic view of an exemplary embodiment of a power rail circuit with separate decoupling capacitance for two power rails and a simulated input/output device load connected thereto for simulation purposes.

To investigate the voltage versus time characteristics of the power rails 207 and 330 of the embodiment depicted in FIG. 5, as well as the dependence of those voltages on various parameters, such as the total capacitance and individual capacitance values selected for the capacitors 245, 250 and 350, 355, a simulation was performed. The simulated circuitry is shown in FIG. 7, which is a schematic like FIG. 5, but with the addition of a simulated input/output load 400 that may represent, for example, the external devices 123 or 125 depicted in FIG. 1. A line 405 with a length L connects the $V_{DDIO}$ rail 207 to the load 400. The simulation was performed with the parameters listed in the following table:

| SIMULATION PARAMETERS | |
|---|---|
| $C_{PHYSICAL}/2$ | 30 nF, 40 nF & 50 nF |
| Length L of line 405 | 76.2 mm, 101.6 mm, 127 mm and 152.4 mm |
| Capacitive load at the load 400 | 3 pF, 6 pF and 12 pF |
| Termination resistance at the load 400 | 50 Ω, 75 Ω and 150 Ω |
| Number of switching signals | 100, 130 and 160 |
| Frequency | 400 MHZ, 333 MHZ, 100 MHZ and 50 MHZ |
| Resistor values $R_{D1}$ and $R_{D2}$ | 400 Ω |
| $C_{VDDIO}$ devoted to $V_{DDIO}$ with multiplier k = 7/8 (See Equation 5) | $\frac{7}{8}\frac{C_{PHYSICAL}}{2} = \frac{7C_{PHYSICAL}}{16}$ |
| $C_{350}$ or $C_{355}$ devoted to $V_{TT}$ with multiplier (1-k) = 1/8 (See Equation 6) | $\frac{1}{8}\frac{C_{PHYSICAL}}{2} = \frac{C_{PHYSICAL}}{16}$ |

The resistor values $R_{D1}$ and $R_{D2}$ are for the resistors 335 and 340 shown in FIG. 7. The value of allocation multiplier k may be any number such that 1>k>0. Slightly less than 1,400 simulation runs were performed using various combinations of the parameters in the foregoing table.

Figure 8:
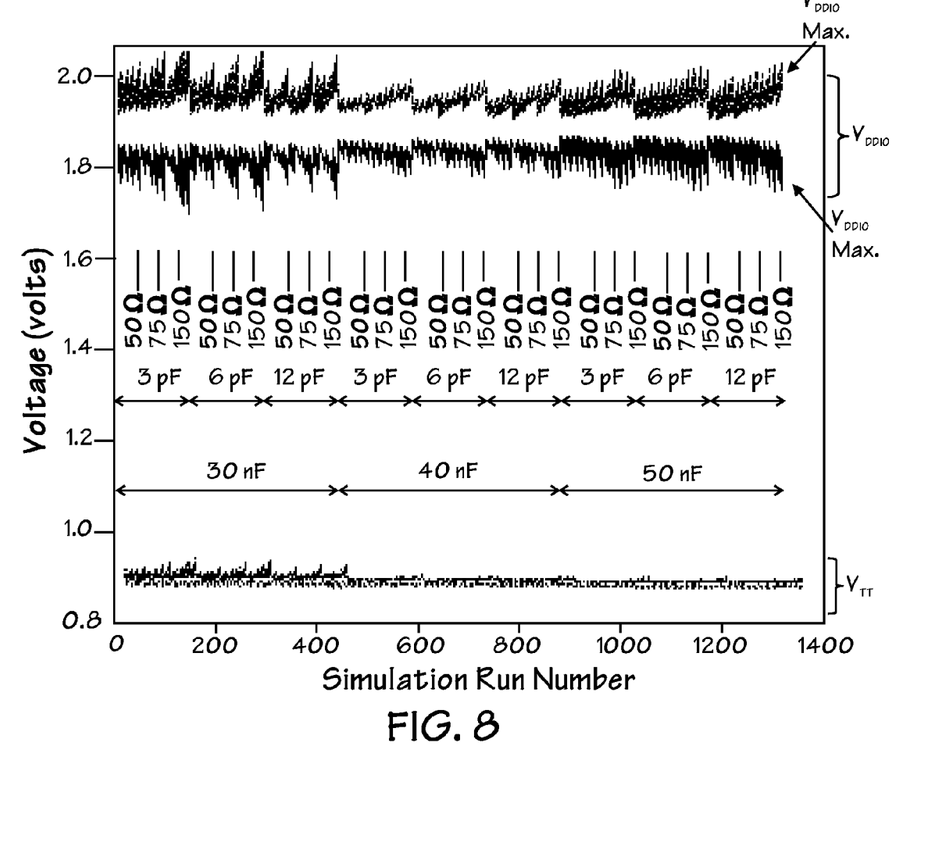
FIG. 8 is a composite plot of voltage versus simulation run for the circuit depicted in FIG. 7.

Attention is turned now to FIG. 8, which is a composite plot of the $V_{DDIO}$ and $V_{TT}$ signals versus simulation run for particular combinations of the parameters set forth in the foregoing table. The upper portion of the plot shows maximum and minimum voltages for voltage $V_{DDIO}$ versus simulation run. The difference between the maximum and minimum represents the noise on the power supply due to loads. The lower portion of the plot shows the voltage signal $V_{TT}$ versus simulation run. Note that the voltage $V_{TT}$ signal is relatively quiet, particularly in the portion of the plot from simulation runs about 450 to nearly 1,400. Indeed, the $V_{TT}$ signal includes a minimum to maximum voltage fluctuation of somewhere on the order of 50 millivolts. The $V_{DDIO}$ signal is somewhat noisier with a minimum to maximum voltage fluctuation of about 300 millivolts. Both of the voltage traces $V_{DDIO}$ and $V_{TT}$ exhibit relatively lower noise levels for a $C_{PHYSICAL}/2$ of 40 nF. The variation in downstream load capacitance and termination resistance from 3 pF to 12 pF and from 50Ω to 150Ω did not cause that much difference in the relative noise levels in the $V_{DDIO}$ and $V_{TT}$ signals.

Figure 9:
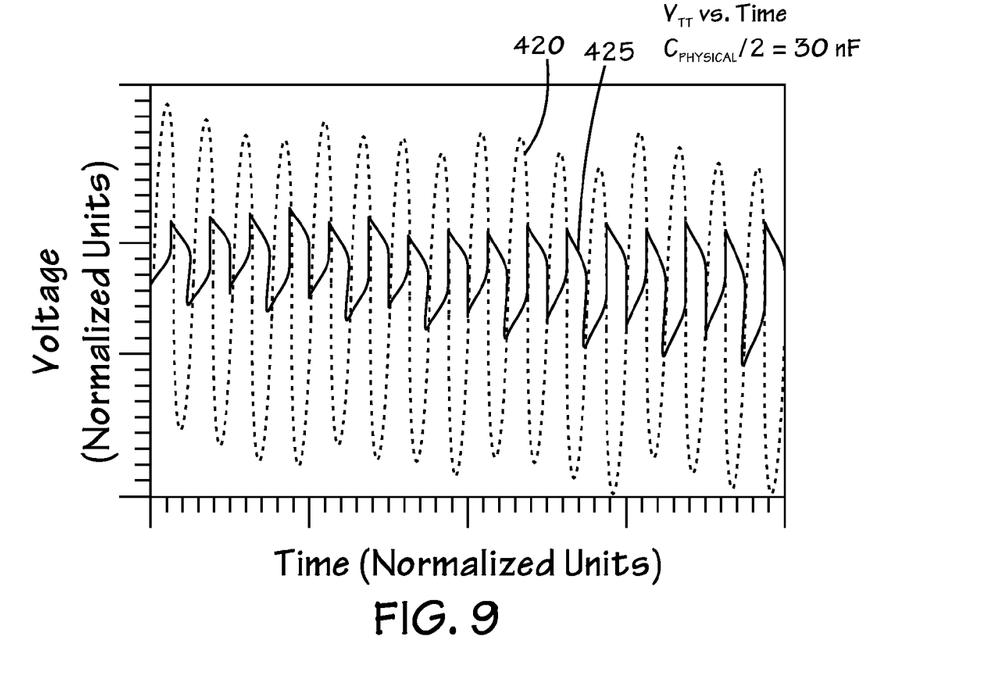
FIG. 9 is a composite plot of voltage versus time for a conventional power rail circuit and an exemplary embodiment of a power rail circuit for a selected capacitance level.

Additional simulations were performed to determine the variation in the quality of the voltage signals $V_{DDIO}$ and $V_{TT}$ as a function of the capacitance selected for $C_{PHYSICAL}/2$. In a first group of two plots depicted in FIGS. 9 and 10, voltage signal $V_{TT}$ versus time for a $C_{PHYSICAL}/2$ of 30 nF is depicted in FIG. 9. The y-axis is voltage in normalized units and the x-axis is time in normalized units. Two plots 420 and 425 are depicted. The plot 420 shown in dashed is the $V_{TT}$ signal obtained using the conventional capacitive decoupling scheme depicted in FIG. 4 where the power rail 209 and signal $V_{TT}$ share the same capacitive decoupling as the power rail 207 and $V_{DDIO}$. The plot 425 depicts the $V_{TT}$ signal as a function of time using the exemplary embodiment depicted in FIG. 5 where $V_{TT}$ is provided with discrete capacitive decoupling from the rail 207 for $V_{DDIO}$. FIG. 9 shows that the $V_{TT}$ versus time signal is substantially less noisy than the $V_{TT}$ signal obtained using the prior art system.

Figure 10:
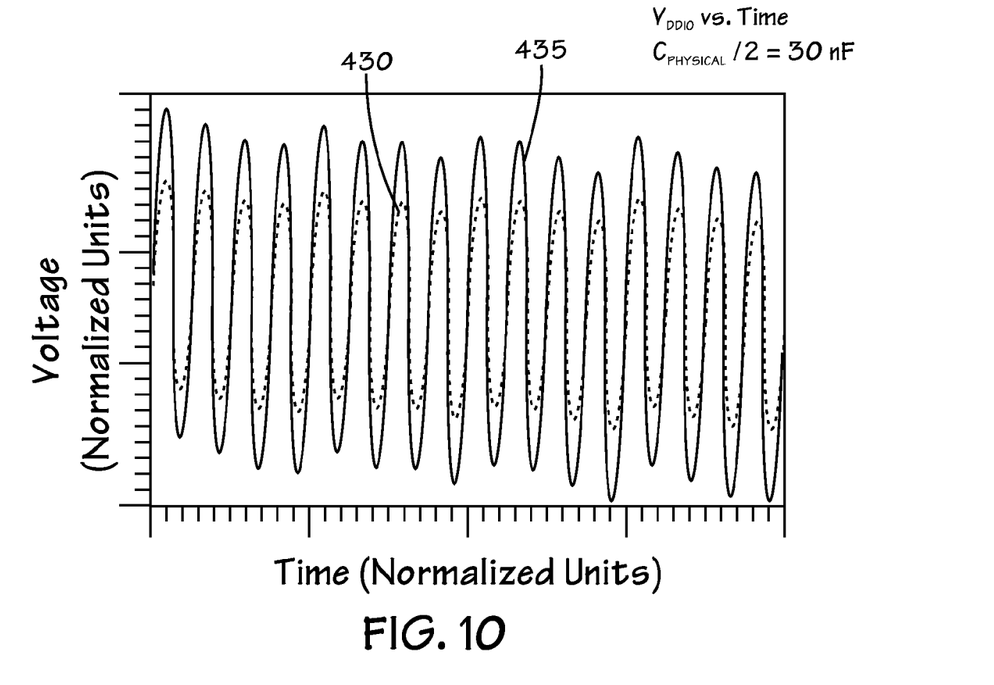
FIG. 10 is another composite plot of voltage versus time for a conventional power rail circuit and an exemplary embodiment of a power rail circuit for the selected capacitance level.

Attention is now turned to FIG. 10, which is a plot like FIG. 9 but for $V_{DDIO}$ versus time again with $C_{PHYSICAL}/2$ equal to 30 nF. Two plots 430 and 435 are depicted. The plot 430 is shown in dashed and is the $V_{DDIO}$ signal obtained using the prior art system depicted in FIG. 4 and the plot 435 is the $V_{DDIO}$ versus time obtained using the embodiment depicted in FIG. 5. The plot 435 is somewhat noisier than the plot 430. Thus, the division of capacitive decoupling for the embodiment of FIG. 5 represents a small increase in the noise level on the $V_{DDIO}$ signal.

Figure 11:
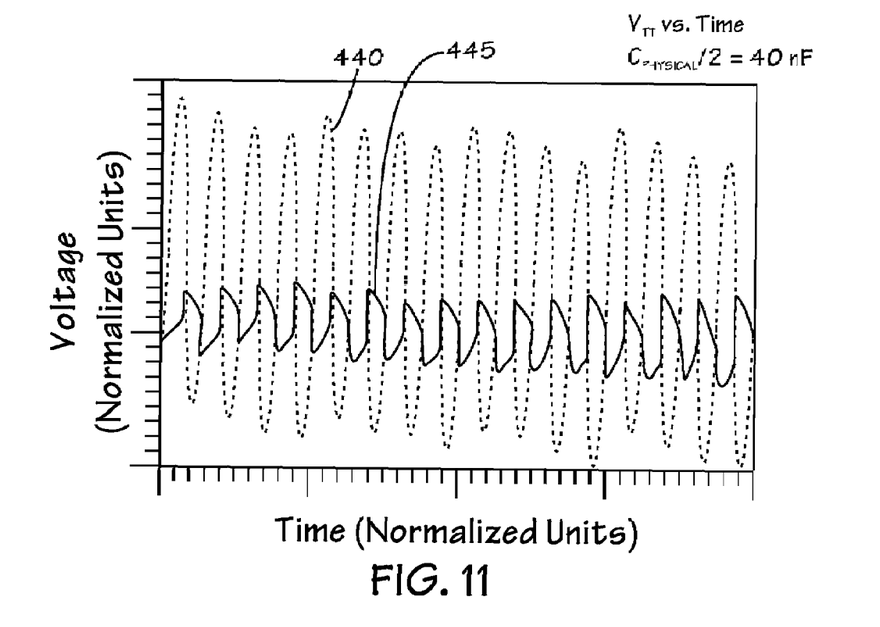
FIG. 11 is another composite plot of voltage versus time for a conventional power rail circuit and an exemplary embodiment of a power rail circuit for another selected capacitance level.
Figure 12:
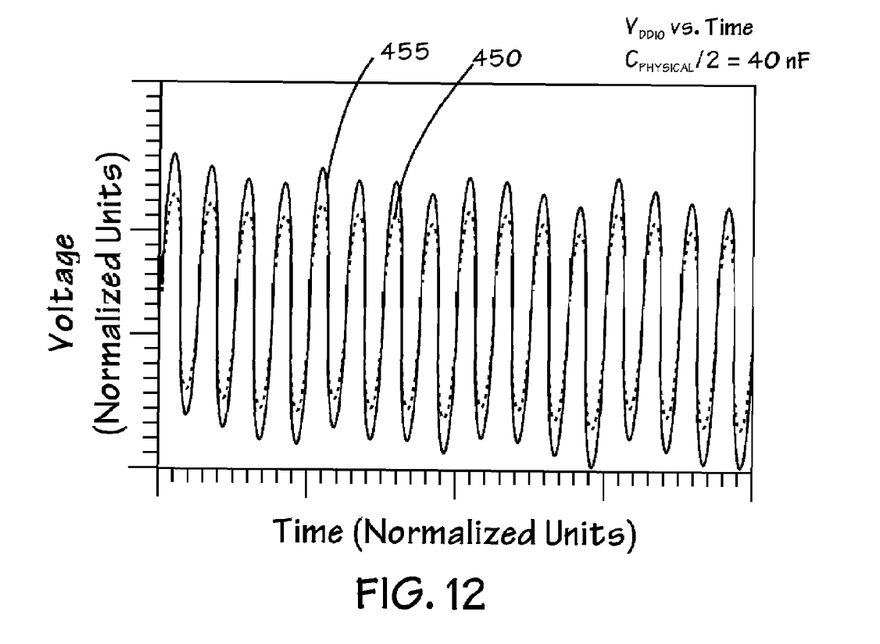
FIG. 12 is another composite plot of voltage versus time for a conventional power rail circuit and an exemplary embodiment of a power rail circuit for the new selected capacitance level.

Attention is now turned to FIGS. 11 and 12, which are plots of the same type as FIGS. 9 and 10 albeit with a $C_{PHYSICAL}/2$ equal to 40 nF. In FIG. 11, two plots 440 and 445 are shown. The plot 440 is in dashed and is a plot of $V_{TT}$ versus time for a system using the prior art system depicted in FIG. 4. The plot 445 is the plot of $V_{TT}$ versus time using the system of the embodiment of FIG. 5. The plot 445 is significantly less noisy than the plot 440. Turning now to FIG. 12, two plots 450 and 455 are shown. The plot 450 is the $V_{DDIO}$ versus time generated using the conventional system depicted in FIG. 4 and the solid plot 455 is the $V_{DDIO}$ signal obtained using the embodiment of FIG. 5. Again, the $V_{DDIO}$ signal is somewhat more noisy using the embodiment of FIG. 5 than the prior art system in FIG. 4. However, that increase in noise in $V_{DDIO}$ is offset by the substantial decrease in the noise level on $V_{TT}$ depicted in FIG. 11. Compared to a $C_{PHYSICAL}/2$ level of 40 nF, the $C_{PHYSICAL}/2$ level of 30 nF likely places the low pass filtering cutoff frequency at too high a level to sufficiently suppress noise induced on $V_{DDIO}$, particularly when $V_{DDIO}$ and $V_{TT}$ are powering current drawing devices at the same time.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising:
   a semiconductor die;
   a first power rail on the semiconductor die and having a first no-load bias voltage from a first voltage source;
   a ground rail on the semiconductor die;
   a first voltage divider on the semiconductor die electrically coupled between the first power rail and the ground rail and having a midpoint node;
   a first pair of capacitors on the semiconductor die, the first of which is electrically coupled between the first power rail and the midpoint node and the second of which is electrically coupled between the midpoint node and the ground rail to provide capacitive decoupling for power delivered to the first power rail;
   a second power rail on the semiconductor die having a second no-load bias voltage from a second voltage source less than the first no-load bias voltage; and
   a second pair of capacitors on the semiconductor die, the first of which is electrically coupled between the ground rail and the second power rail and the second of which is electrically coupled between the second power rail and the ground rail to provide capacitive decoupling for power delivered to the second power rail.

2. The apparatus of claim 1, comprising a first printed circuit board coupled to the semiconductor die.

3. The apparatus of claim 2, comprising a second printed circuit board coupled to the first printed circuit board.

4. The apparatus of claim 1, wherein the second power rail is biased by said second voltage source internal to the semiconductor die.

5. The apparatus of claim 4, wherein the source internal to the semiconductor die comprises a second voltage divider coupled between the first power rail and the ground rail and having a second midpoint node, the second power rail being coupled to the second midpoint node.

6. The apparatus of claim 1, wherein the second power rail is biased by said second voltage source external to the semiconductor die.

7. The apparatus of claim 1, wherein the semiconductor die comprises a microprocessor.

8. The apparatus of claim 1, wherein the second pair of capacitors comprises two pluralities of parallel-connected capacitors.

9. The apparatus of claim 1, wherein the semiconductor die comprises a total amount of available decoupling capacitance, a first portion thereof being apportioned to the first pair of capacitors and a second and smaller portion being apportioned to the second pair of capacitors.

10. An apparatus, comprising:
    a semiconductor die;
    an input/output circuit on the semiconductor die including a first power rail having a first no-load bias voltage from a first voltage source, a ground rail, a first voltage divider electrically coupled between the first power rail and the ground rail and having a midpoint node, and a first pair of capacitors, the first of which is electrically coupled between the first power rail and the midpoint node and the second of which is electrically coupled between the midpoint node and the ground rail to provide capacitive decoupling for power delivered on the first power rail;
    a second power rail on the semiconductor die having a second no-load bias voltage from a second voltage source less than the first no-load bias voltage; and
    a second pair of capacitors on the semiconductor die, the first of which is electrically coupled between the ground rail and the second power rail and the second of which is electrically coupled between the second power rail and the ground rail to provide capacitive decoupling for power delivered to the second power rail.

11. The apparatus of claim 10, comprising a first printed circuit board coupled to the semiconductor die.

12. The apparatus of claim 11, comprising a second printed circuit board coupled to the first printed circuit board.

13. The apparatus of claim 10, wherein the second power rail is biased by internal to the semiconductor die.

14. The apparatus of claim 13, wherein the source internal to the semiconductor die comprises a second voltage divider coupled between the first power rail and the ground rail and having a second midpoint node electrically coupled to the second power rail.

15. The apparatus of claim 10, wherein the second power rail is biased by said second voltage source external to the semiconductor die.

16. The apparatus of claim 10, wherein the semiconductor die comprises a microprocessor.

17. The apparatus of claim 10, wherein the second pair of capacitors comprises two pluralities of parallel-connected capacitors.

18. The apparatus of claim 10, wherein the semiconductor die comprises a total amount of available decoupling capacitance, a first portion thereof being apportioned to the first pair of capacitors and a second and smaller portion being apportioned to the second pair of capacitors.

19. A method, comprising:
providing a semiconductor die with a first power rail for a first no-load bias voltage level from a first voltage source, a second power rail for a second no-load bias voltage level from a second voltage source less than the first no-load bias voltage level, and a ground rail;
electrically coupling a first voltage divider on the semiconductor die between the first power rail and the ground rail, the first voltage divider including a midpoint node;
electrically coupling a first capacitor of a first pair of capacitors on the semiconductor die between the first power rail and the midpoint node and the second capacitor of the first pair of capacitors between the midpoint node and the ground rail to provide capacitive decoupling for power delivered to the first power rail; and
electrically coupling a first capacitor of a second pair of capacitors on the semiconductor die between the ground rail and the second power rail and the second capacitor of the second pair of capacitors between the second power rail and the ground rail to provide capacitive decoupling for power delivered to the second power rail.

20. The method of claim 19, comprising coupling a first printed circuit board to the semiconductor die.

21. The method of claim 20, comprising coupling a second printed circuit board to the first printed circuit board.

22. The method of claim 19, comprising providing a source internal to the semiconductor die to bias the second power rail.

23. The method of claim 22, wherein the providing of a source internal to the semiconductor die comprises electrically coupling a second voltage divider on the semiconductor die between the first power rail and the ground rail and that includes a second midpoint node electrically coupled to the second power rail.

24. The method of claim 19, comprising providing a source external to the semiconductor die to bias the second power rail.

25. The method of claim 19, wherein the providing of a semiconductor die comprises providing a microprocessor.

26. The method of claim 19, wherein the electrically coupling the second pair of capacitors comprises electrically coupling two pluralities of parallel-connected capacitors.

27. The method of claim 19, comprising providing the semiconductor die with a total amount of available decoupling capacitance, apportioning a first portion thereof to the first pair of capacitors and apportioning a second and smaller portion thereof to the second pair of capacitors.

* * * * *